(12) United States Patent
Kim et al.

(10) Patent No.: US 10,811,641 B2
(45) Date of Patent: Oct. 20, 2020

(54) DISPLAY DEVICE AND MANUFACTURING METHOD THEREOF

(71) Applicant: Samsung Display Co., Ltd., Yongin-si, Gyeonggi-do (KR)

(72) Inventors: Jun Gi Kim, Hwaseong-si (KR); Jin-Su Byun, Seoul (KR); Yang-Ho Jung, Seoul (KR); Eui Suk Jung, Seoul (KR); Seon Hwa Choi, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/171,486

(22) Filed: Oct. 26, 2018

(65) Prior Publication Data

US 2019/0157628 A1    May 23, 2019

(30) Foreign Application Priority Data

Nov. 20, 2017    (KR) .................. 10-2017-0155035

(51) Int. Cl.
| | |
|---|---|
| *H01L 51/00* | (2006.01) |
| *H01L 51/56* | (2006.01) |
| *H01L 27/32* | (2006.01) |
| *H01L 51/52* | (2006.01) |
| *H01L 27/12* | (2006.01) |

(52) U.S. Cl.
CPC .......... *H01L 51/56* (2013.01); *H01L 27/1225* (2013.01); *H01L 27/1248* (2013.01); *H01L 27/3244* (2013.01); *H01L 27/3258* (2013.01); *H01L 51/5203* (2013.01); *H01L 51/5253* (2013.01); *H01L 51/5284* (2013.01); *H01L 2227/323* (2013.01)

(58) Field of Classification Search
None
See application file for complete search history.

(56) References Cited

U.S. PATENT DOCUMENTS

| | | | |
|---|---|---|---|
| 9,368,561 B2 | 6/2016 | Murakami et al. | |
| 2001/0025958 A1* | 10/2001 | Yamazaki | ............... H01L 21/00 257/72 |

(Continued)

FOREIGN PATENT DOCUMENTS

| | | |
|---|---|---|
| KR | 1020120049512 A | 5/2012 |
| KR | 1020130063250 A | 6/2013 |
| KR | 101560599 B1 | 10/2015 |

*Primary Examiner* — Benjamin P Sandvik
(74) *Attorney, Agent, or Firm* — Cantor Colburn LLP

(57) ABSTRACT

A display device includes: a substrate on which is disposed: an organic light emitting element which generates and emits light with which an image is displayed; a thin film transistor connected to the organic light emitting element and with which the organic light emitting element is controlled to emit the light; an interlayer insulating layer disposed between the thin film transistor and the organic light emitting element, the interlayer insulating layer including an organic material; and a capping layer disposed between the interlayer insulating layer and the organic light emitting element, the capping layer including an inorganic material. The interlayer insulating layer disposed between the thin film transistor and the organic light emitting element does not have photosensitivity and does not include sulfur.

5 Claims, 16 Drawing Sheets

(56) References Cited

U.S. PATENT DOCUMENTS

| | | | |
|---|---|---|---|
| 2004/0246432 A1* | 12/2004 | Tsuchiya | H01L 27/3246 349/187 |
| 2012/0175615 A1* | 7/2012 | You | H01L 51/5265 257/57 |
| 2013/0168648 A1* | 7/2013 | Jeong | H01L 27/3225 257/40 |
| 2017/0018736 A1 | 1/2017 | Yamazaki et al. | |
| 2018/0197929 A1* | 7/2018 | Cho | H01L 51/5265 |
| 2019/0181205 A1* | 6/2019 | Kim | H01L 27/3276 |
| 2019/0386084 A1* | 12/2019 | Park | H01L 27/3258 |

* cited by examiner

DISPLAY DEVICE AND MANUFACTURING METHOD THEREOF

This application claims priority to Korean Patent Application No. 10-2017-0155035 filed on Nov. 20, 2017, and all the benefits accruing therefrom under 35 U.S.C. § 119, the entire contents of which are incorporated herein by reference.

BACKGROUND

(a) Field

The present disclosure relates to a display device and a manufacturing method thereof, and in detail, relates to a display device and a manufacturing method for preventing deterioration of a light emission characteristic of an organic emission layer.

(b) Description of the Related Art

An organic light emitting diode ("OLED") display includes two electrodes and an organic emission layer interposed therebetween.

Electrons injected from one electrode and holes injected from the other electrode are combined in the organic emission layer to generate excitons.

The generated excitons are changed to a ground state from an excited state, releasing energy to emit light.

The organic light emitting diode display includes a plurality of pixels including an organic light emitting diode as a self-emissive element, and a plurality of transistors for driving the organic light emitting diode are disposed in each pixel.

The plurality of transistors generally includes a switching transistor and a driving transistor. An interlayer insulating layer is disposed between the transistors and the electrodes. The interlayer insulating layer includes or is made of an organic material, and a gas is generated inside the interlayer insulating layer during a process of baking the organic material.

SUMMARY

Exemplary embodiments provide a display device and a manufacturing method for preventing deterioration of the light emission characteristic of the organic emission layer from gas generated during forming of an interlayer insulating layer under the organic emission layer.

A display device according to an exemplary embodiment includes: a substrate on which is disposed: an organic light emitting element which generates and emits light with which an image is displayed; a thin film transistor connected to the organic light emitting element and with which the organic light emitting element is controlled to emit the light; an interlayer insulating layer disposed between the thin film transistor and the organic light emitting element, the interlayer insulating layer including an organic material; and a capping layer disposed between the interlayer insulating layer and the organic light emitting element, the capping layer including an inorganic material. The interlayer insulating layer disposed between the thin film transistor and the organic light emitting element does not have photosensitivity and does not include sulfur.

The display device may further include first contact holes respectively defined in the interlayer insulating layer and the capping layer and aligned with each other. The film transistor may be connected to the organic light emitting element at the first contact holes which are aligned with each other.

The display device may further include a first contact hole defined in the interlayer insulating layer. The capping layer may extend along a side surface of the interlayer insulating layer at the first contact hole thereof to define a second contact hole in the capping layer, the second contact hole being disposed within the first contact hole, and the film transistor may be connected to the organic light emitting element at the second contact hole of the capping layer which is disposed within the first contact hole of the interlayer insulating layer.

The display device may further include first contact holes respectively defined in the interlayer insulating layer and the capping layer and aligned with each other. The thin film transistor may be connected to the organic light emitting element at the first contact holes which are aligned with each other, and an opening may be defined in the capping layer which exposes the interlayer insulating layer, the opening disposed spaced apart from the organic light emitting element.

The display device may further include a groove overlapping the opening in the capping layer.

The interlayer insulating layer may include a black color pigment or a dye.

A manufacturing method of a display device according to an exemplary embodiment includes: forming a thin film transistor which is connectable to an organic light emitting element and with which the organic light emitting element is controlled to emit light for displaying an image, on a substrate; forming an interlayer insulating layer including an organic material, on the thin film transistor, by baking the organic material, where the interlayer insulating layer does not have photosensitivity; forming a capping layer including an inorganic material, on the interlayer insulating layer including the baked organic material; forming a first photosensitive film pattern on the capping layer; etching the capping layer by using the first photosensitive film pattern as a mask, to form a contact hole in the capping layer at the thin film transistor; etching the interlayer insulating layer including the baked organic material by using the first photosensitive film pattern and the etched capping layer as a mask, to form a contact hole in the interlayer insulating layer at the thin film transistor; and forming an organic light emitting element on the etched capping layer to dispose the etched capping layer and the etched interlayer insulating layer between the organic light emitting element and the thin film transistor. The contact holes respectively in the etched interlayer insulating layer and the etched capping layer are aligned with each other, and the forming of the organic light emitting element connects the organic light emitting element with the thin film transistor at the aligned contact holes.

The etching of the capping layer may further include forming an opening that is spaced apart from the organic light emitting element in the capping layer, and the etching of the interlayer insulating layer may further includes forming a groove overlapping the opening in the interlayer insulating layer.

A manufacturing method of a display device according to another exemplary embodiment includes: forming a thin film transistor which is connectable to an organic light emitting element and with which the organic light emitting element is controlled to emit light for displaying an image; forming an interlayer insulating layer including an organic material on the thin film transistor; forming a capping layer including an inorganic material on the interlayer insulating layer; forming a first photosensitive film pattern including:

a first thickness at the thin film transistor, in which is defined a first opening at the thin film transistor, and a second thickness less than the first thickness, spaced apart from the first opening at the thin film transistor; first etching the capping layer and the interlayer insulating layer by using the first photosensitive film pattern as a mask, to form a contact hole in each of the capping layer and the interlayer insulating layer at the thin film transistor; after the first etching, decreasing the first and second thicknesses of the first photosensitive film pattern to form a second photosensitive film pattern; second etching the capping layer by using the second photosensitive film pattern as a mask, to form an opening in the capping layer which is spaced apart from the thin film transistor and exposes the interlayer insulating layer; and forming an organic light emitting element on the capping layer. The contact holes respectively in the etched interlayer insulating layer and the etched capping layer are aligned with each other, and the forming of the organic light emitting element connects the organic light emitting element with the thin film transistor at the aligned contact holes.

The interlayer insulating layer may not have photosensitivity, and before the forming of the capping layer, the forming of the interlayer insulating layer may include baking the organic material.

The interlayer insulating layer may include a black color pigment or a dye.

According to one or more exemplary embodiments, deterioration of a light emission characteristic of the organic emission layer due to gas generated in forming the interlayer insulating layer thereunder may be reduced or effectively prevented.

BRIEF DESCRIPTION OF THE DRAWINGS

The above and other advantages and features of this disclosure will become more apparent by describing in further detail exemplary embodiments thereof with reference to the accompanying drawings, in which.

DETAILED DESCRIPTION

Figure 1:
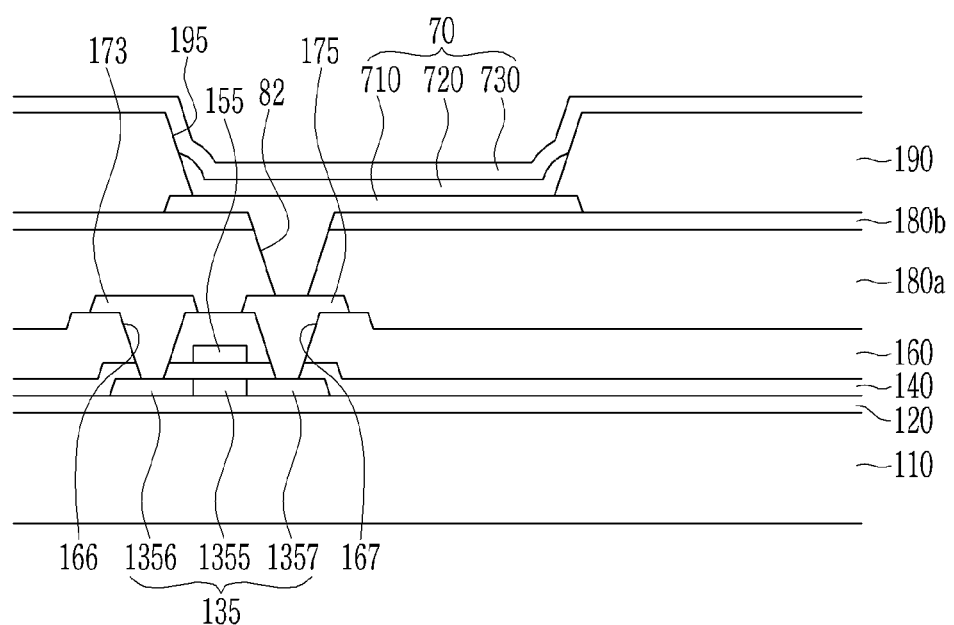
FIG. 1 is a cross-sectional view of an exemplary embodiment of a display device according to the invention.

The invention will be described more fully hereinafter with reference to the accompanying drawings, in which exemplary embodiments of the invention are shown. As those skilled in the art would realize, the described embodiments may be modified in various different ways, all without departing from the spirit or scope of the invention.

In order to clearly explain the invention, portions that are not directly related to the invention are omitted, and the same reference numerals are attached to the same or similar constituent elements through the entire specification.

In addition, the size and thickness of each configuration shown in the drawings are arbitrarily shown for better understanding and ease of description, but the invention is not limited thereto. In the drawings, the thickness of layers, films, panels, regions, etc., are exaggerated for clarity. In the drawings, for better understanding and ease of description, the thicknesses of some layers and areas are exaggerated.

It will be understood that when an element such as a layer, film, region, or substrate is referred to as being related to another element such as being "on" another element, it can be directly on the other element or intervening elements may also be present. In contrast, when an element is referred to as being related to another element such as being "directly on" another element, there are no intervening elements present. Further, in the specification, the word "on" or "above" means disposed on or below the object portion, and does not necessarily mean disposed on the upper side of the object portion based on a gravitational direction.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. In addition, unless explicitly described to the contrary, the word "comprise" and variations such as "comprises" or "comprising" will be understood to imply the inclusion of stated elements but not the exclusion of any other elements.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Further, in the specification, the phrase "on a plane" means viewing the object portion from the top, and the phrase "on a cross-section" means viewing a cross-section of which the object portion is vertically cut from the side.

An organic light emitting diode display among display devices includes a pixel provided in plurality at which light is emitted to display an image. The pixel may include a display region where light is emitted to display an image, and a non-display region at which light is not emitted and the image is not displayed. The pixel includes an organic light emitting diode as a self-emissive element which generates and emits light to display the image. The pixel further includes a plurality of transistors for driving the organic light emitting diode. An electrode of the organic light emitting diode is connected to a transistor among the plurality of transistors.

An interlayer insulating layer is disposed between the transistors and the electrodes. The interlayer insulating layer includes or is made of an organic material, and a gas is generated inside the interlayer insulating layer during a process of baking the organic material. The generated gas moves to an upper surface of the interlayer insulating layer and is shielded by the electrode disposed on the interlayer insulating layer such that the gas may not be discharged. Therefore, by the gas remaining shielded by the electrode, the organic emission layer may be degraded, or a color of the electrode layer of the organic element may be changed, thereby deteriorating the light emission characteristic of the organic emission layer.

A display device according to an exemplary embodiment will now be described with reference to FIG. 1. FIG. 1 is a cross-sectional view of an exemplary embodiment of a display device according to the invention.

The display device and components thereof may be disposed in a plane defined by a first direction and a second direction which cross each other. The first or second direction may be represented by the horizontal direction in FIG. 1. A thickness of the display device and components thereof is taken in a third direction which crosses each of the first and second directions. The third (thickness) direction is represented by the vertical direction in FIG. 1.

The display device according to the present exemplary embodiment includes a (base) substrate 110. The substrate 110 may be flexible.

A buffer layer 120 is disposed on the substrate 110. The buffer layer 120 may include a single layer of an insulating layer such as a silicon nitride ($SiN_x$) and a silicon oxide ($SiO_x$), or a plurality of multilayers in which a silicon nitride ($SiN_x$) and a silicon oxide ($SiO_x$) are stacked. The buffer layer 120 reduces or effectively prevents unnecessary components or contaminants such as an impurity or moisture from being penetrated into layers of the display device on the buffer layer 120.

A semiconductor layer 135 is disposed on the buffer layer 120. The semiconductor layer 135 may include a polysilicon or an oxide semiconductor. In this case, the oxide semiconductor may include at least one oxide of titanium (Ti), hafnium (Hf), zirconium (Zr), aluminum (Al), tantalum (Ta), germanium (Ge), zinc (Zn), gallium (Ga), tin (Sn) and indium (In), and complex oxides thereof.

The semiconductor layer 135 includes a channel region 1355, and a source region 1356 and a drain region 1357 which are disposed at respective sides of the channel region 1355 opposing each other with respect to the channel region 1355. The channel region 1355 of the semiconductor layer 135 is a region at which the impurity is not doped, and the source region 1356 and the drain region 1357 of the semiconductor layer 135 are regions at which a conductive impurity is doped. In an exemplary embodiment of manufacturing the display device, the channel region 1355, the source region 1356 and the drain region 1357 may be formed from a same single material layer, but are doped at different concentrations from each other.

A gate insulating layer 140 is disposed on the semiconductor layer 135. The gate insulating layer 140 may be a single layer including tetraethyl orthosilicate ("TEOS"), a silicon oxide ($SiO_x$) or a silicon nitride ($SiN_x$), or a multi-layer thereof.

A gate electrode 155 is disposed on the gate insulating layer 140. The gate electrode 155 overlaps the channel region 1355 in a view along a thickness direction of the display device of the plane defined in the first and second directions. The gate electrode 155 may include or be made of the single layer or multiple layers including a relatively low resistance material and/or a relatively high corrosion-resistant material such as aluminum (Al), titanium (Ti), molybdenum (Mo), copper (Cu), nickel (Ni), or alloys thereof.

A first interlayer insulating layer 160 is disposed on the gate electrode 155. The first interlayer insulating layer 160 may include a single layer of tetraethyl orthosilicate ("TEOS"), a silicon oxide ($SiO_x$) or a silicon nitride ($SiN_x$), or multiple layers thereof.

The first interlayer insulating layer 160 and the gate insulating layer 140 have a source contact hole 166 and a drain contact hole 167 defined therein respectively overlapping the source region 1356 and the drain region 1357.

A source electrode 173 and a drain electrode 175 are disposed on the first interlayer insulating layer 160.

The source electrode 173 and the drain electrode 175 are respectively connected to the source region 1356 and the drain region 1357 of the semiconductor layer 135 through or at the source contact hole 166 and the drain contact hole 167.

The source electrode 173 and the drain electrode 175 may include or be made of a single layer or multiple layers including a relatively low resistance material or a relatively high corrosion-resistant material such as aluminum (Al), titanium (Ti), molybdenum (Mo), copper (Cu), nickel (Ni) or alloys thereof.

The semiconductor layer 135, the gate electrode 155, the source electrode 173, and the drain electrode 175 form a switching element of a pixel, such as a driving thin film transistor of the pixel.

The structure of the pixel of the display device shown in FIG. 1 is just one example, and the pixel structure of the display device according to the invention is not limited thereto. In the shown exemplary embodiment, only the driving thin film transistor of the pixel is shown, however a signal line and an organic light emitting diode included in the pixel may include or be formed with various structures within a range which can be easily modified by technical experts. Accordingly, the display device is not limited to the number of various components thereof such as thin film transistors, capacitors and conductive (or signal) wires.

A second interlayer insulating layer 180a is disposed on the source electrode 173 and the drain electrode 175.

The second interlayer insulating layer 180a includes an organic material. The second interlayer insulating layer 180a does not include sulfur and does not have photosensitivity. In an exemplary embodiment of a method of manufacturing a display device, forming the second interlayer insulating layer 180a including or made of the organic material includes a baking process.

In a conventional method of manufacturing a display device, a gas may be generated while the organic material is cured through the baking process. Particularly, a sulfur oxide generated in the baking process is a component that induces the degradation of the organic light emitting element.

According to one or more exemplary embodiment of manufacturing the display device according to the invention, since the second interlayer insulating layer 180a does not include sulfur, gas generation inducing the display quality deterioration of the display device is reduced. Accordingly, even if the gas is generated during the baking, the influence on the degradation of the organic light emitting element may be reduced.

Also, as the second interlayer insulating layer 180a does not have photosensitivity, so when forming the contact hole in the second interlayer insulating layer 180a, the second interlayer insulating layer 180a is not directly exposed and is etched by using an etching mask.

If the second interlayer insulating layer 180a has photosensitivity and is directly exposed to form the contact hole such as in a conventional method of manufacturing a display device, a portion of the second interlayer insulating layer 180a becomes fluid near the contact hole such that the second interlayer insulating layer 180a may remain therein. Accordingly, the contact hole is formed to be undesirably larger than an intended size in the second interlayer insulating layer 180a, and an aperture ratio of the display device is reduced.

However, according to one or more exemplary embodiment of the display device according to the invention, as the second interlayer insulating layer 180a does not have photosensitivity, the fluidity due to direct exposure does not occur, and the aperture ratio reduction of the display device may be reduced or effectively prevented. The process of forming the contact hole in the second interlayer insulating layer 180a will be described later in detail.

The second interlayer insulating layer 180a may be transparent, or may include a black color pigment or a dye. When the second interlayer insulating layer 180a includes the black color pigment or the dye, reflection of light incident from outside the display device is reduced or effectively prevented, thereby reducing or effectively preventing the display quality deterioration due to interference of the external light with light used to display an image.

In an exemplary embodiment, for example, the second interlayer insulating layer 180a may include at least one among an acryl, a polyimide and a siloxane-based binder.

A capping layer 180b is disposed on the second interlayer insulating layer 180a. The capping layer 180b includes an inorganic material. In an exemplary embodiment, for example, a silicon nitride ($SiN_x$), a silicon oxide ($SiO_x$), a silicon oxynitride (SiON) or a silicon oxycarbide (SiOC) may be included in the capping layer 180b. A dielectric constant of the capping layer 180b may be about 1 to about 10.

As above-described, the second interlayer insulating layer 180a includes the organic material, and the baking process is included in a method for forming the second interlayer insulating layer 180a.

In a conventional method of manufacturing a display device, the gas may be generated while the organic material is cured through the baking process. All of the gas may not be discharged, and may remain within the second interlayer insulating layer 180a until forming an organic light emitting element (70 described later). This gas may be discharged to the organic light emitting element (70 described later), thereby the organic light emitting element 70 may be undesirably degraded. Therefore, the light emission characteristic of a conventional display device may be deteriorated by the degradation of the organic light emitting element 70.

However, one or more exemplary embodiment of the display device according to the invention capping layer 180b disposed on the second interlayer insulating layer 180a and including inorganic material. The capping layer 180b may reduce or effectively prevent the gas generated when forming the second interlayer insulating layer 180a from being discharged to the organic light emitting element 70. Accordingly, as degradation of the organic light emitting element 70 from the gas generated when forming the insulating layer including or made of organic material may be reduced or effectively prevented, the light emission characteristic deterioration due to the degradation of the organic light emitting element 70 may be reduced or effectively prevented.

The second interlayer insulating layer 180a and the capping layer 180b have a contact hole 82 defined therein overlapping the drain electrode 175. The contact hole 82 of the capping layer 180b and the contact hole 82 of the second interlayer insulating layer 180a are vertically aligned. In an exemplary embodiment of a method of manufacturing a display device, for example, after forming the contact hole 82 in the capping layer 180b, the underlying second interlayer insulating layer 180a is etched by using the capping layer 180b as a mask, and the contact hole 82 that is vertically aligned with the contact hole 82 of the capping layer 180b is formed in the second interlayer insulating layer 180a. This manufacturing method is described in detail later.

A pixel electrode 710 is disposed on the capping layer 180b. The pixel electrode 710 is connected to the drain electrode 175 through and at the contact hole 82. The pixel electrode 710 may be an anode of the organic light emitting element 70.

A partition wall (layer) 190 is disposed on the pixel electrode 710. The partition wall 190 has or defines a first opening 195 overlapping the pixel electrode 710. The partition wall 190 may include or be formed to include a polyacrylate-based resin or a polyimide-based resin, and a silica-based inorganic material.

An organic emission layer 720 is disposed in the first opening 195 of the partition wall 190.

The organic emission layer 720 may include or be made of multiple layers including a light emission layer and one or more among a hole-injection layer ("HIL"), a hole-transporting layer ("HTL"), an electron-transporting layer ("ETL"), and an electron-injection layer ("EIL"). In the case where the organic emission layer 720 includes all the layers described above, the hole-injection layer is disposed on the pixel electrode 710 which is an anode, and the hole-transporting layer, the emission layer, the electron-transporting layer and the electron-injection layer may be sequentially laminated thereon.

A common electrode 730 is disposed on the partition wall 190 and the organic emission layer 720. The common electrode 730 becomes a cathode of the organic light emitting element. Accordingly, the pixel electrode 710, the organic emission layer 720 and the common electrode 730 together form an organic light emitting element 70.

The organic light emitting diode display may have any one structure among a top display type, a rear display type and a dual-side display type according to a direction in which the organic light emitting element 70 emits light.

In the case of the top display type, the pixel electrode 710 may be a reflective layer, and the common electrode 730 may be a semi-transparent layer or a transparent layer. On the other hand, in the case of the bottom display type, the pixel electrode 710 may be the semi-transparent layer, and the common electrode 730 may be the reflective layer. Also, in the case of the dual-side display type, the pixel electrode 710 and the common electrode 730 may be the transparent layer or the semi-transparent layer.

The reflective layer and the semi-transparent layer include or are made from one or more metals of magnesium (Mg), silver (Ag), gold (Au), calcium (Ca), lithium (Li), chromium (Cr) and aluminum (Al), or an alloy thereof. The reflective layer and the semi-transparent layer respectively have a thickness. The semi-transparent layer may have a thickness of about 200 nanometers (nm) or less. Transmittance of light is increased as the thickness is reduced, but if the thickness is very small, resistance is increased. The transparent layer includes or is formed of a material such as indium tin oxide ("ITO"), indium zinc oxide "ITO"), zinc oxide (ZnO) or indium oxide ($In_2O_3$).

The common electrode 730 may be disposed on the entire surface of the substrate 110. That is, the common electrode 730 may be common to each pixel among a plurality of pixels.

As above-described, the second interlayer insulating layer 180a disposed under the organic light emitting element 70 includes the organic material. The baking process is included in the process for forming the second interlayer insulating layer 180a including or made of the organic material. A gas may be generated while the organic material is cured through the baking process.

All of the gas generated in a conventional method of manufacturing a display device may not be discharged until the organic light emitting element 70 is formed on the second interlayer insulating layer 180a. The remaining gas that is not all discharged when forming the second interlayer insulating layer 180a may be discharged to the organic light emitting element 70, and the organic emission layer 720 or the pixel electrode 710 of the organic light emitting element 70 may be degraded. In this way, the light emission characteristic may be deteriorated by the degradation of the organic light emitting element 70.

However, in one or more exemplary embodiment of the display device according to the invention, the capping layer 180b including the inorganic material is disposed between the second interlayer insulating layer 180a including the organic material and the organic light emitting element 70. The capping layer 180b may reduce or effectively prevent the gas generated when forming the second interlayer insulating layer 180a from being discharged to the organic light emitting element 70.

Although not shown, an encapsulation layer (not shown) may be disposed on the common electrode 730. The encapsulation layer may extend from an upper surface of the common electrode 730 to the substrate 110, to encapsulate layers of the display device on the substrate 110. The encapsulation layer may include or be formed by alternately depositing at least one inorganic layer and at least one organic layer. In an exemplary embodiment, the encapsulation layer may include a plurality of inorganic layers or a plurality of organic layers alternated with each other.

Next, a manufacturing method of the display device according to an exemplary embodiment will be described with reference to FIG. 2 to FIG. 5 along with FIG. 1. FIG. 2 to FIG. 5 are cross-sectional views showing an exemplary embodiment of a method for manufacturing the display device of FIG. 1 according to the invention.

Figure 2:
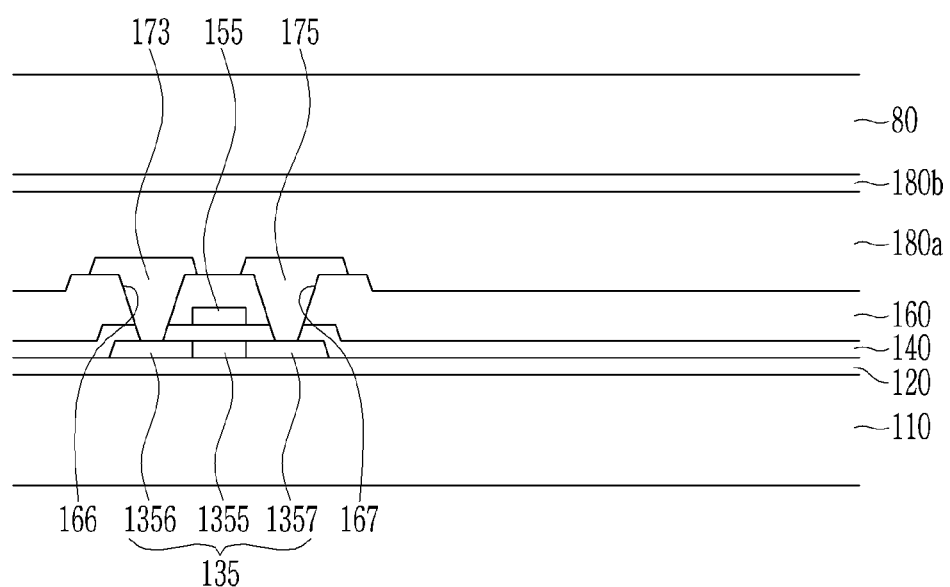
FIG. 2 to FIG. 5 are cross-sectional views showing an exemplary embodiment of a method for manufacturing the display device of FIG. 1 according to the invention.

Referring to FIG. 2, a buffer layer 120 is deposited on a substrate 110, a semiconductor layer 135 including a channel region 1355, and a source region 1356 and a drain region 1357 disposed at respective sides of the channel region 1355, is formed on the buffer layer 120, a gate insulating layer 140 is formed on the semiconductor layer 135, a gate electrode 155 is formed on the gate insulating layer 140, a first interlayer insulating layer 160 is formed on the gate electrode 155, a source electrode 173 and a drain electrode 175 are formed on the first interlayer insulating layer 160, a second interlayer insulating layer 180a is formed on the source electrode 173 and the drain electrode 175, a capping layer 180b is deposited on the second interlayer insulating layer 180a, and a photosensitive layer 80 is deposited on the capping layer 180b.

In detail, the capping layer 180b is deposited on the second interlayer insulating layer 180a after completing the baking process when forming the second interlayer insulating layer 180a.

Figure 3:
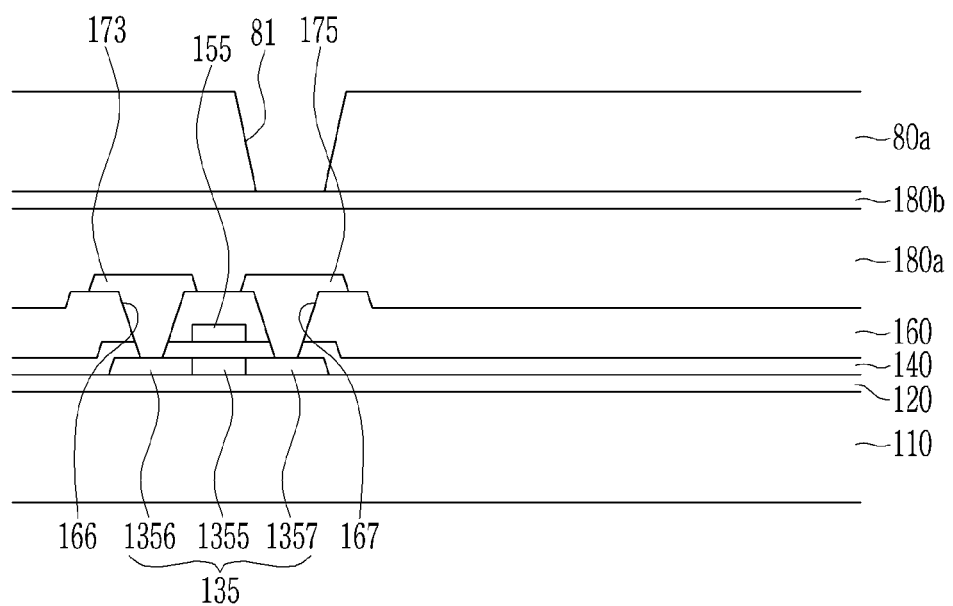

As shown in FIG. 3, the photosensitive layer 80 is exposed while using an exposure mask (not shown) to form a first photosensitive film pattern 80a including a second opening 81 at a position corresponding to a contact hole 82 overlapping the drain electrode 175.

Figure 4:
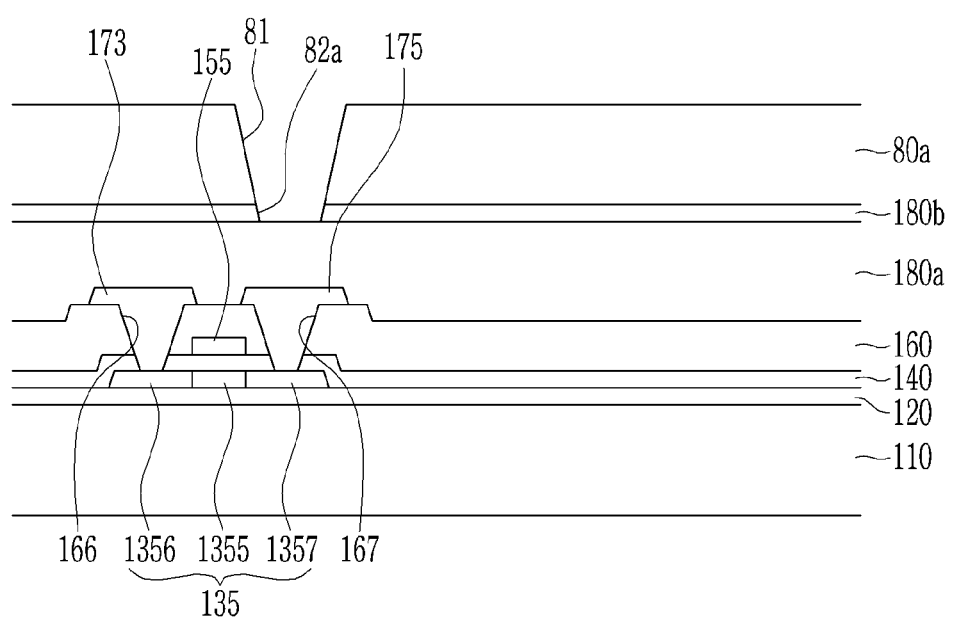

Referring to FIG. 4, the capping layer 180b is exposed by using the first photosensitive film pattern 80a as a mask to form a first hole 82a in the capping layer 180b.

Figure 5:
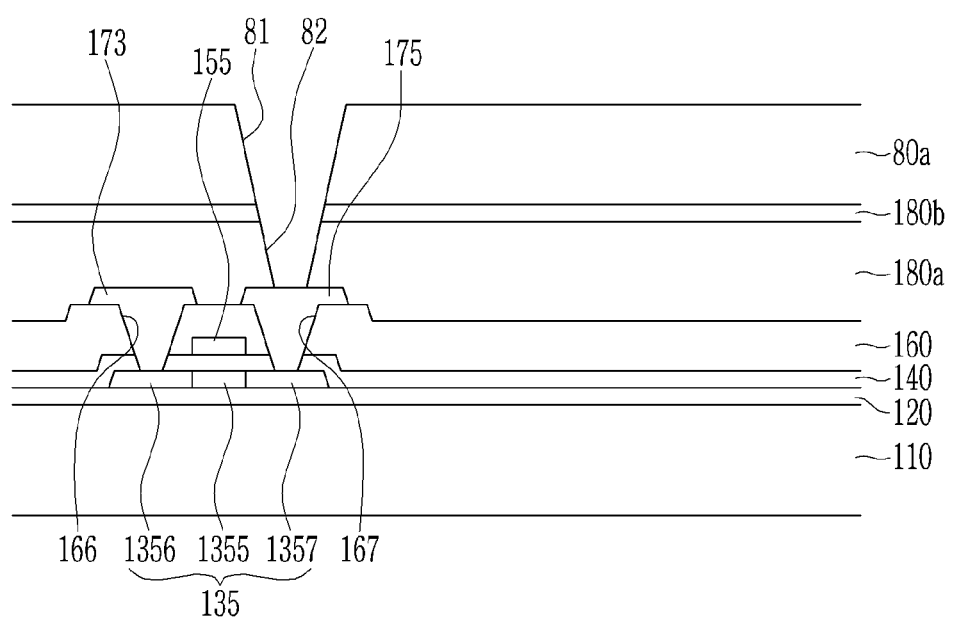

The second interlayer insulating layer 180a is etched by using the capping layer 180b including the first hole 82a as the mask to form in the second interlayer insulating layer 180a a hole 82 vertically aligned with the first hole 82a of the capping layer 180b. As shown in FIG. 5, the collective contact hole 82 overlapping the drain electrode 175 is commonly formed in the second interlayer insulating layer 180a and the capping layer 180b. The first photosensitive film pattern 80a is removed after forming the contact hole 82.

As shown in FIG. 1, a pixel electrode 710 is formed on the capping layer 180b, a partition wall 190 is formed on the pixel electrode 710, and an organic emission layer 720 and a common electrode 730 are formed on the pixel electrode 710 and the partition wall 190 to manufacture the display device.

As above-described, in one or more exemplary embodiment of the manufacturing method of the display device according to the invention, after forming the second interlayer insulating layer 180a including or made of the organic material, the capping layer 180b is deposited thereon, the capping layer 180b is etched by using the photosensitive film pattern as a mask, and then the second interlayer insulating layer 180a is etched by using the capping layer 180b as the etching mask. In this way, the (inorganic) capping layer 180b covering the (organic) second interlayer insulating layer 180*a* is deposited after forming the second interlayer insulating layer 180*a*, the capping layer 180*b* is etched by using one exposure mask, and then the second interlayer insulating layer 180*a* is etched using the same one exposure mask, thereby forming the capping layer 180*b* without the addition of another exposure mask.

Also, as the capping layer 180*b* is deposited on the second interlayer insulating layer 180*a* after completing the baking process when forming the second interlayer insulating layer 180*a*. That is, since the second interlayer insulating layer 180*a* is exposed to outside during the baking process thereof, the gas generated during the baking process of the second interlayer insulating layer 180*a* is discharged to the outside. As such, the second interlayer insulating layer 180*a* is additionally covered and protected by the capping layer 180*b* after the gas generated during the baking process of the second interlayer insulating layer 180*a* is discharged to the outside. Accordingly, discharge of the gas that may be generated when forming the second interlayer insulating layer 180*a* to the pixel electrode 710 and the organic emission layer 720 may be reduced or effectively prevented.

Also, after curing the second interlayer insulating layer 180*a* including or made of the organic material through the baking process, the second interlayer insulating layer 180*a* is etched by using the capping layer 180*b* as the mask to form the contact hole 82 having a relatively small dimension, thereby preventing the aperture ratio deterioration of the display device.

In general, in a conventional display device in which the organic material has photosensitivity, when the baking is executed after forming the contact hole through an exposure process, the organic material may flow around the contact hole, accordingly reducing the size of the contact hole. As such, when the baking is executed after forming the contact hole, the initial contact hole is formed to be larger than the final size to be formed in the organic layer, and in this case, the increased size of the contact hole reduces the aperture ratio of the display device.

Figure 6:
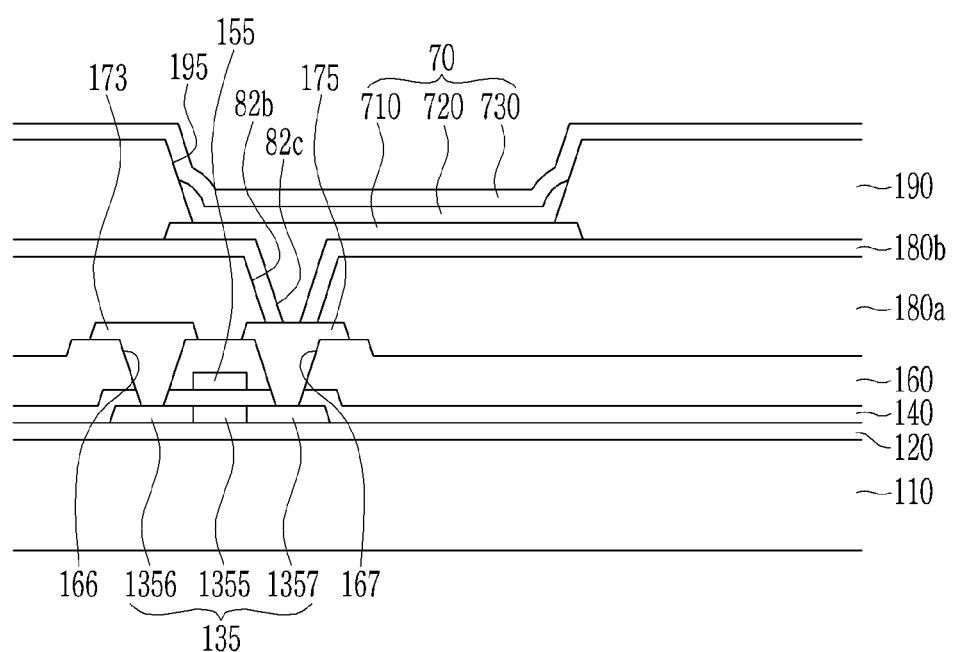
FIG. 6 is a cross-sectional view of another exemplary embodiment of a display device according to the invention.

The display device according to another exemplary embodiment will now be described with reference to FIG. 6. FIG. 6 is a cross-sectional view of another exemplary embodiment of a display device according to the invention. Referring to FIG. 6, the display device according to the present exemplary embodiment is similar to the display device according to the exemplary embodiment described with reference to FIG. 1. The detailed description for the same constituent elements is omitted.

In the display device according to the present exemplary embodiment, the buffer layer 120 is disposed on the substrate 110.

The semiconductor layer 135 including the channel region 1355, and the source region 1356 and the drain region 1357, disposed at respective sides of the channel region 1355, is disposed on the buffer layer 120.

The gate insulating layer 140 is disposed on the semiconductor layer 135, the gate electrode 155 is disposed on the gate insulating layer 140, and the first interlayer insulating layer 160 is disposed on the gate electrode 155. The first interlayer insulating layer 160 and the gate insulating layer 140 have a source contact hole 166 and a drain contact hole 167 defined therein respectively overlapping the source region 1356 and the drain region 1357.

The source electrode 173 and the drain electrode 175 are disposed on the first interlayer insulating layer 160, and the second interlayer insulating layer 180*a* is disposed on the source electrode 173 and the drain electrode 175. The second interlayer insulating layer 180*a* has a first contact hole 82*b* defined therein overlapping the drain electrode 175. The second interlayer insulating layer 180*a* includes the organic material. The second interlayer insulating layer 180*a* does not include sulfur and does not have photosensitivity. In an exemplary embodiment, for example, the second interlayer insulating layer 180*a* may include at least one among an acryl, a polyimide and a siloxane-based binder. The second interlayer insulating layer 180*a* may be transparent, or may include the black color pigment or the dye.

The capping layer 180*b* is disposed on the second interlayer insulating layer 180*a*. The capping layer 180*b* has a second contact hole 82*c* defined therein overlapping the drain electrode 175. The second contact hole 82*c* is aligned with the first contact hole 82*b*. The capping layer 180*b* on an upper surface of the second interlayer insulating layer 180*a* extends along a side surface of the second interlayer insulating layer 180*a* at the first contact hole 82*b* to be disposed in the first contact hole 82*b*. The second contact hole 82*c* defined by the capping layer 180*b* is disposed within the first contact hole 82*b* defined by the second interlayer insulating layer 180*a*. The capping layer 180*b* includes the inorganic material. In an exemplary embodiment, for example, a silicon nitride ($SiN_x$), a silicon oxide ($SiO_x$), a silicon oxynitride (SiON), or a silicon oxycarbide (SiOC) may be included in the capping layer 180*b*. The dielectric constant of the capping layer 180*b* may be about 1 to about 10.

The pixel electrode 710 is disposed on the capping layer 180*b*, and the partition wall 190 is disposed on the pixel electrode 710. The partition wall 190 has the first opening 195 defined therein overlapping the pixel electrode 710. The organic emission layer 720 is disposed in the first opening 195 of the partition wall 190. The common electrode 730 is disposed on the partition wall 190 and the organic emission layer 720. The pixel electrode 710, the organic emission layer 720 and the common electrode 730 form the organic light emitting element 70.

As above-described, the second interlayer insulating layer 180*a* disposed under the organic light emitting element 70 includes the organic material. In a process of forming the second interlayer insulating layer 180*a* including or made of the organic material, a baking process is included. The gas may be generated while the organic material is cured through the baking process.

All of the gas generated in a conventional method of manufacturing a display device may not be discharged until the organic light emitting element 70 is formed on the second interlayer insulating layer 180*a*. The remaining gas that is not all discharged when forming the second interlayer insulating layer 180*a* may be discharged to the organic light emitting element 70, and the organic emission layer 720 or the pixel electrode 710 of the organic light emitting element 70 may be degraded. In this way, the light emission characteristic may be deteriorated by the degradation of the organic light emitting element 70.

However, in one or more exemplary embodiment of the display device according to the invention, the capping layer 180*b* including the inorganic material is disposed between the second interlayer insulating layer 180*a* including the organic material and the organic light emitting element 70. As the second interlayer insulating layer 180*a* does not include sulfur, the gas generation element causing the display quality deterioration of the display device is reduced. Accordingly, even if the gas is generated during the baking, the influence on the degradation of the organic light emitting element 70 may be reduced.

Also, as the second interlayer insulating layer 180*a* does not have photosensitivity, when forming the contact hole in the second interlayer insulating layer 180a, the second interlayer insulating layer 180a is not directly exposed and is etched by using an etching mask, thereby reducing or effectively preventing the reduction of the aperture ratio of the display device.

The capping layer 180b overlying the second interlayer insulating layer 180a may prevent the gas generated when forming the second interlayer insulating layer 180a from being discharged to the organic light emitting element 70. Also, according to one or more exemplary embodiment of the display device according to the invention, as the capping layer 180b is also disposed along the side surface of the second interlayer insulating layer 180a at the first contact hole 82b, discharge through the contact hole of the gas generated when forming the second interlayer insulating layer 180a may be reduced or effectively prevented.

Figure 7:
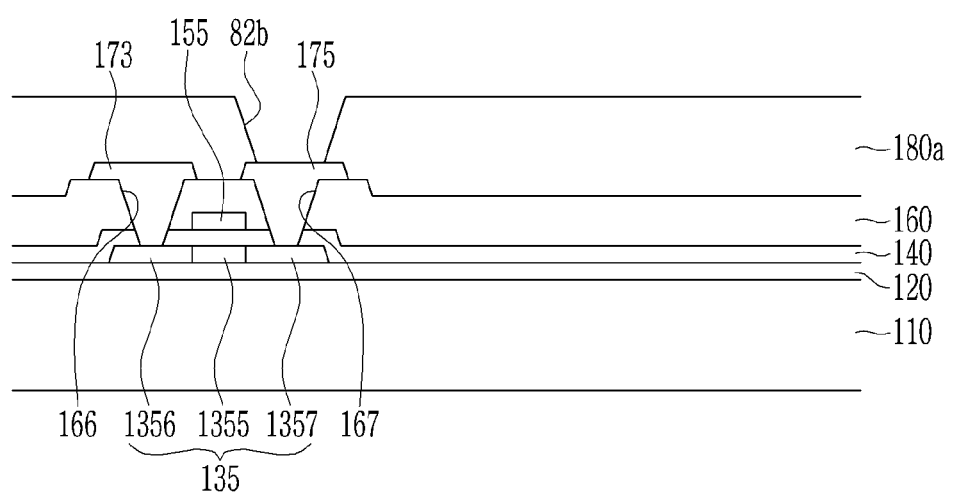
FIG. 7 and FIG. 8 are cross-sectional views showing an exemplary embodiment of a method for manufacturing the display device of FIG. 6 according to the invention.
Figure 8:
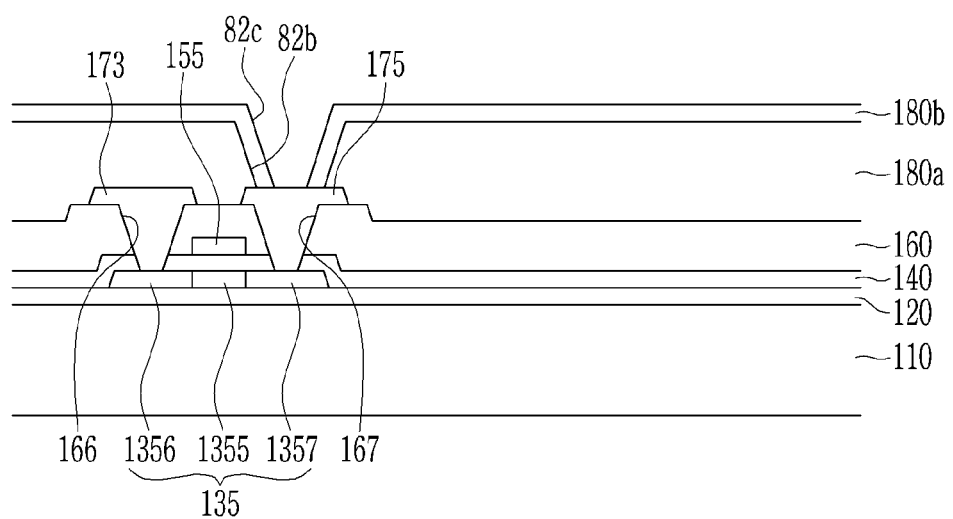

Next, a manufacturing method of the display device according to another exemplary embodiment will be described with reference to FIG. 7 and FIG. 8 along with FIG. 6. FIG. 7 and FIG. 8 are cross-sectional views showing an exemplary embodiment of a method for manufacturing the display device of FIG. 6 according to the invention.

Referring to FIG. 7, a buffer layer 120 is deposited on a substrate 110, a semiconductor layer 135 including a channel region 1355, and a source region 1356 and a drain region 1357 disposed at respective sides of the channel region 1355, is formed on the buffer layer 120, a gate insulating layer 140 is formed on the semiconductor layer 135, a gate electrode 155 is formed on the gate insulating layer 140, a first interlayer insulating layer 160 is formed on the gate electrode 155, a source electrode 173 and a drain electrode 175 are formed on the first interlayer insulating layer 160, and a second interlayer insulating layer 180a having the first contact hole 82b overlapping the drain electrode 175 is formed on the source electrode 173 and the drain electrode 175.

In detail, an organic material layer is deposited on the source electrode 173 and the drain electrode 175, and the organic material layer is cured by executing the baking process. The cured organic material layer is etched to form the second interlayer insulating layer 180a having the first contact hole 82b defined therein.

As shown in FIG. 8, the capping layer 180b having the second contact hole 82c defined therein is formed on the second interlayer insulating layer 180a to dispose the second contact hole 82c within the first contact hole 82b of the second interlayer insulating layer 180a.

The capping layer 180b is formed to also be extended along the side surface of the second interlayer insulating layer 180a at the first contact hole 82b, and the second contact hole 82c of the capping layer 180b is formed to be disposed within the first contact hole 82b of the second interlayer insulating layer 180a.

As shown in FIG. 6, the pixel electrode 710 is formed on the capping layer 180b, the partition wall 190 is formed on the pixel electrode 710, and the organic emission layer 720 and the common electrode 730 are formed on the pixel electrode 710 and the partition wall 190 to manufacture the display device.

As above-described, in one or more exemplary embodiment of the manufacturing method of the display device according to the invention, as the capping layer 180b covering the second interlayer insulating layer 180a is formed after forming the second interlayer insulating layer 180a, the capping layer 180b is formed on the second interlayer insulating layer 180a after the baking process for forming the second interlayer insulating layer 180a is completed. Accordingly, as the second interlayer insulating layer 180a is additionally covered and protected by the capping layer 180b after the gas generated during the baking process is discharged to the outside, discharge to the pixel electrode 710 and the organic emission layer 720 of the gas generated when forming the second interlayer insulating layer 180a may be reduced or effectively prevented.

Figure 9:
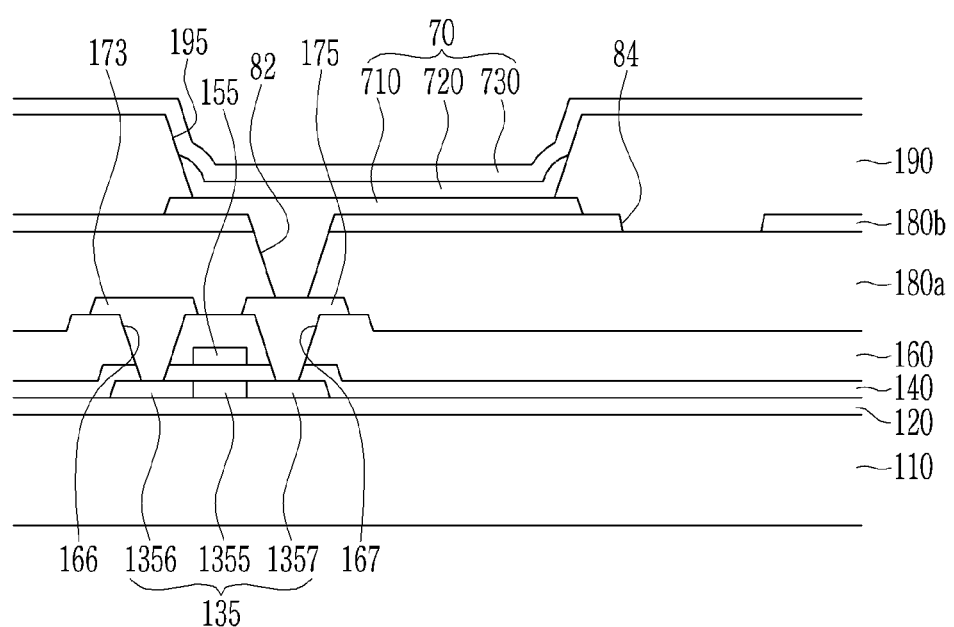
FIG. 9 is a cross-sectional view of still another exemplary embodiment of a display device according to the invention.

The display device according to another exemplary embodiment will now be described with reference to FIG. 9. FIG. 9 is a cross-sectional view of still another exemplary embodiment of a display device according to the invention. Referring to FIG. 9, the display device according to the present exemplary embodiment is similar to the display device according to the exemplary embodiment described with reference to FIG. 1. The detailed description for the same constituent elements is omitted.

In the display device according to the present exemplary embodiment, the buffer layer 120 is disposed on the substrate 110.

The semiconductor layer 135 including the channel region 1355, and the source region 1356 and the drain region 1357 disposed at respective sides of the channel region 1355, is disposed on the buffer layer 120.

The gate insulating layer 140 is disposed on the semiconductor layer 135, the gate electrode 155 is disposed on the gate insulating layer 140, and the first interlayer insulating layer 160 is disposed on the gate electrode 155. The first interlayer insulating layer 160 and the gate insulating layer 140 have a source contact hole 166 and a drain contact hole 167 defined therein respectively overlapping the source region 1356 and the drain region 1357.

The source electrode 173 and the drain electrode 175 are disposed on the first interlayer insulating layer 160, and the second interlayer insulating layer 180a is disposed on the source electrode 173 and the drain electrode 175. The second interlayer insulating layer 180a includes the organic material. The second interlayer insulating layer 180a does not sulfur and does not have photosensitivity. In an exemplary embodiment, for example, the second interlayer insulating layer 180a may include at least one among an acryl, a polyimide, and a siloxane-based binder. The second interlayer insulating layer 180a may be transparent, or may include the black color pigment or the dye.

The capping layer 180b is disposed on the second interlayer insulating layer 180a. The capping layer 180b includes the inorganic material. In an exemplary embodiment, for example, the capping layer 180b may include a silicon nitride ($SiN_x$), a silicon oxide ($SiO_x$), a silicon oxynitride (SiON), or a silicon oxycarbide (SiOC). The dielectric constant of the capping layer 180b may be about 1 to about 10.

The second interlayer insulating layer 180a and the capping layer 180b have the contact hole 82 therein overlapping the drain electrode 175, and the contact hole 82 of the capping layer 180b and the contact hole 82 of the second interlayer insulating layer 180a are vertically aligned with each other. The capping layer 180b has a third opening 84 defined therein disposed at a position that does not overlap the organic light emitting element 70.

The pixel electrode 710 is disposed on the capping layer 180b, and the pixel electrode 710 is connected to the drain electrode 175 through and at the contact hole 82.

The partition wall 190 is disposed on the pixel electrode 710. The partition wall 190 has the first opening 195 defined therein overlapping the pixel electrode 710.

The organic emission layer 720 is disposed in the first opening 195 of the partition wall 190.

The common electrode 730 is disposed on the partition wall 190 and the organic emission layer 720. The pixel electrode 710, the organic emission layer 720, and the common electrode 730 form the organic light emitting element 70.

As above-described, the second interlayer insulating layer 180a disposed under the organic light emitting element 70 includes the organic material. In a process of forming the second interlayer insulating layer 180a including or made of the organic material, the baking process is included. The gas may be generated while the organic material is cured through the baking process.

All of the gas generated in a conventional method of manufacturing a display device may not be discharged until the organic light emitting element 70 is formed on the second interlayer insulating layer 180a. The remaining gas that is not all discharged when forming the second interlayer insulating layer 180a may be discharged to the organic light emitting element 70, and the organic emission layer 720 or the pixel electrode 710 of the organic light emitting element 70 may be degraded. In this way, the light emission characteristic may be deteriorated by the degradation of the organic light emitting element 70.

However, in one or more exemplary embodiment of the display device according to the invention, the capping layer 180b including the inorganic material is disposed between the second interlayer insulating layer 180a including the organic material and the organic light emitting element 70. As the second interlayer insulating layer 180a does not include sulfur, the gas generation element causing the display quality deterioration of the display device is reduced. Accordingly, even if the gas is generated during the baking, the influence on the degradation of the organic light emitting element 70 may be reduced.

Also, as the second interlayer insulating layer 180a does not have photosensitivity, when forming the contact hole in the second interlayer insulating layer 180a, the second interlayer insulating layer 180a is not directly exposed and is etched by using the etching mask, thereby reducing or effectively preventing the reduction of the aperture ratio of the display device.

The capping layer 180b overlying the second interlayer insulating layer 180a may prevent the gas generated when forming the second interlayer insulating layer 180a from being discharged to the organic light emitting element 70. Also, according to one or more exemplary embodiment of the display device according to the invention, as the capping layer 180b has the third opening 84 defined therein disposed at the position that does not overlap the organic light emitting element 70, the remaining gas among the gas generated when forming the second interlayer insulating layer 180a may be discharged through the third opening 84. Accordingly, discharge to the organic light emitting element 70 of the gas generated when forming the second interlayer insulating layer 180a is further reduced or effectively prevented.

Next, a manufacturing method of the display device according to another exemplary embodiment will be described with reference to FIG. 10 to FIG. 13 along with FIG. 9. FIG. 10 to FIG. 13 are cross-sectional views showing an exemplary embodiment of a method for manufacturing the display device of FIG. 9 according to the invention.

Figure 10:
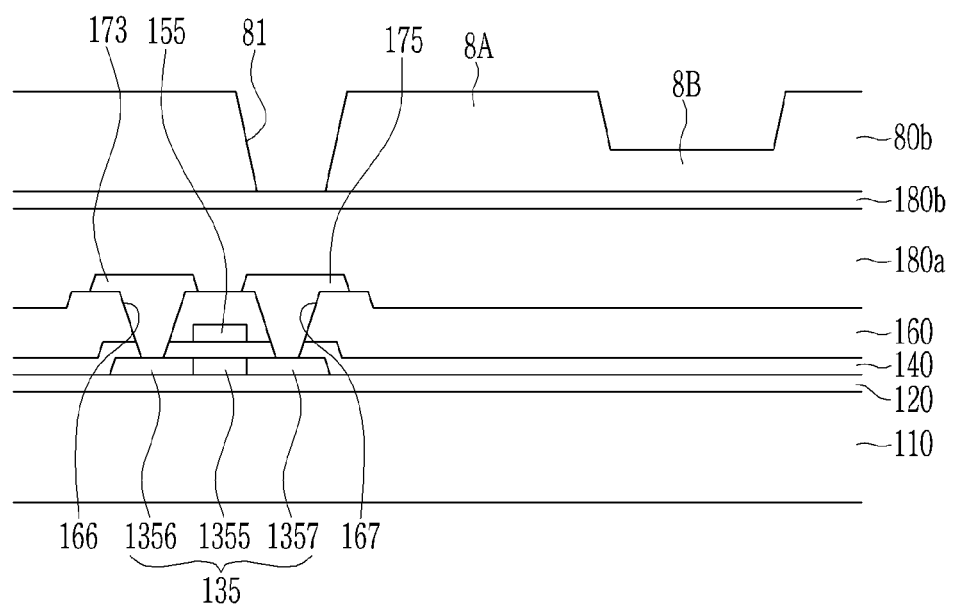
FIG. 10 to FIG. 13 are cross-sectional views showing an exemplary embodiment of a method for manufacturing the display device of FIG. 9 according to the invention.

Referring to FIG. 10, the buffer layer 120 is deposited on the substrate 110, the semiconductor layer 135 including the channel region 1355, and the source region 1356 and the drain region 1357 disposed at respective sides of the channel region 1355, is formed on the buffer layer 120, the gate insulating layer 140 is formed on the semiconductor layer 135, the gate electrode 155 is formed on the gate insulating layer 140, the first interlayer insulating layer 160 is formed on the gate electrode 155, the source electrode 173 and the drain electrode 175 are formed on the first interlayer insulating layer 160, the second interlayer insulating layer 180a is formed on the source electrode 173 and the drain electrode 175, the capping layer 180b is deposited on the second interlayer insulating layer 180a, and a second photosensitive film pattern 80b is formed on the capping layer 180b by using the exposure mask and the exposure.

The second photosensitive film pattern 80b has the second opening 81 defined therein at the position to form the contact hole 82 overlapping the drain electrode 175. The second photosensitive film pattern 80b includes a first portion 8A having a first thickness and a second portion 8B having a second thickness that is smaller than the first thickness, relative to the underlying first interlayer insulating layer 160. The second portion 8B having the second thickness of the second photosensitive film pattern 80b is disposed at the position where the third opening 84 of the capping layer 180b is to be formed.

In detail, the capping layer 180b is deposited on the second interlayer insulating layer 180a after completing the baking process when forming the second interlayer insulating layer 180a.

Figure 11:
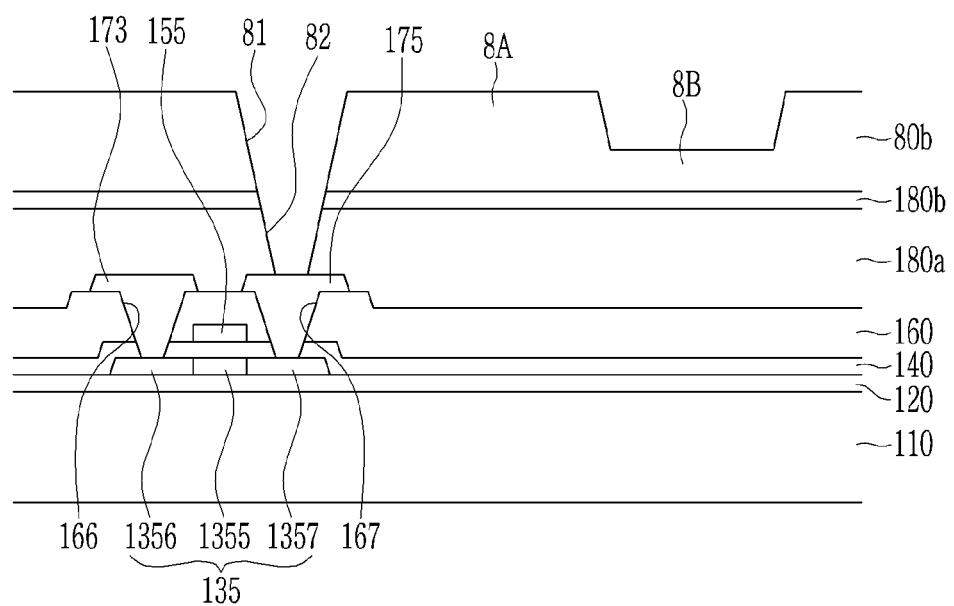

As shown in FIG. 11, the capping layer 180b and the second interlayer insulating layer 180a are exposed by using the second photosensitive film pattern 80b as the mask to form the contact hole 82 in the capping layer 180b and the second interlayer insulating layer 180a and overlapping the second opening 81 of the second photosensitive film pattern 80b.

Figure 12:
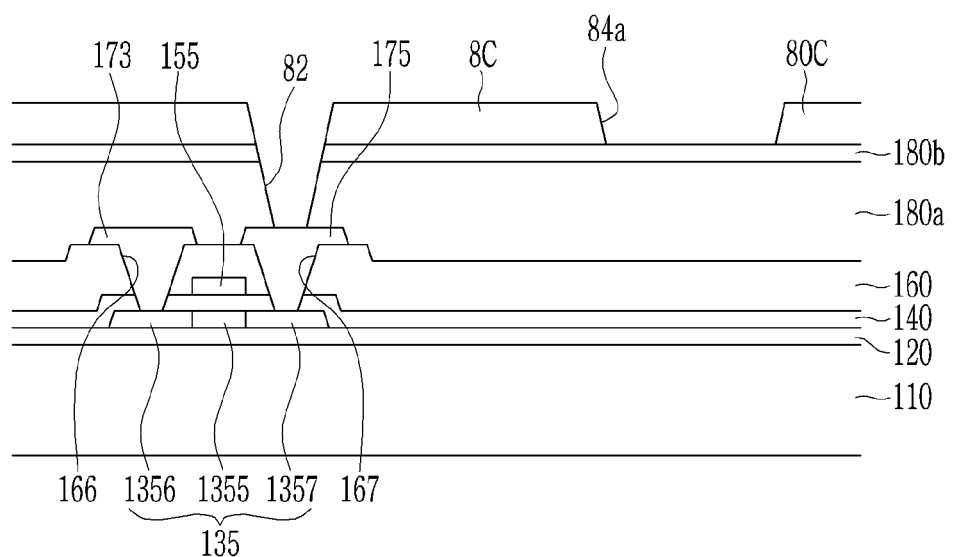

Referring to FIG. 12, an etch back process decreasing a height of the second photosensitive film pattern 80b is executed to remove the second photosensitive film pattern 80b disposed at the position where the third opening 84 of the capping layer 180b is to be formed. Thereby a third photosensitive film pattern 80C including a third portion 8C at a third thickness and having a fourth opening 84a disposed at the position where the third opening 84 of the capping layer 180b is disposed is formed.

Figure 13:
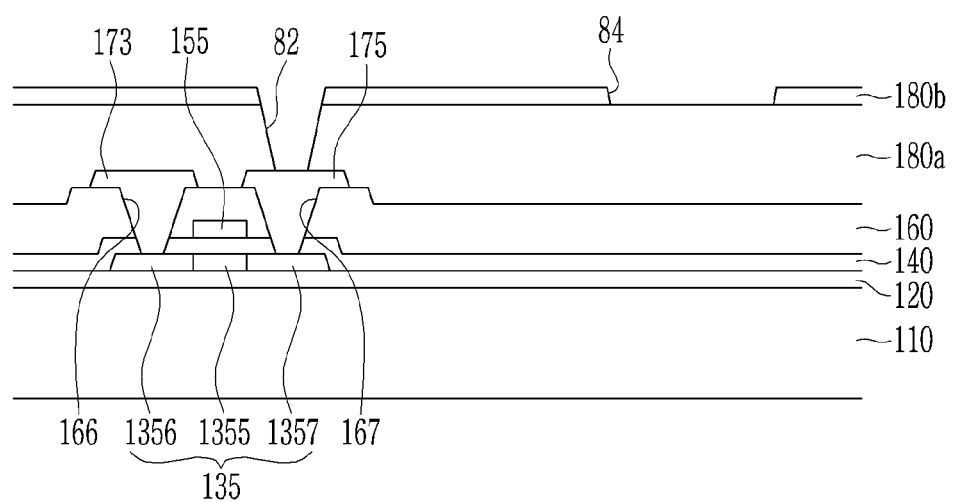

The capping layer 180b is etched by using the third photosensitive film pattern 80C having the fourth opening 84a formed at the position where the third opening 84 of the capping layer 180b is to be disposed as the mask. As shown in FIG. 13, the third opening 84 is formed in the capping layer 180b. The third photosensitive film pattern 80C is removed after forming the third opening 84.

As shown in FIG. 9, the pixel electrode 710 is formed on the capping layer 180b, the partition wall 190 is formed on the pixel electrode 710, and the organic emission layer 720 and the common electrode 730 are formed on the pixel electrode 710 and the partition wall 190 to manufacture the display device.

According to one or more exemplary embodiment of the manufacturing method of the display device according to the invention, as the capping layer 180b covering the second interlayer insulating layer 180a is formed after forming the second interlayer insulating layer 180a, the capping layer 180b is formed on the second interlayer insulating layer 180a after the baking process for forming the second interlayer insulating layer 180a is completed. That is, since the second interlayer insulating layer 180a is exposed to outside during the baking process thereof, the gas generated during the baking process of the second interlayer insulating layer 180a is discharged to the outside. Accordingly, as the second interlayer insulating layer 180*a* is additionally covered and protected by the capping layer 180*b* after the gas generated during the baking process is discharged to the outside, discharge of the gas generated when forming the second interlayer insulating layer 180*a* to the pixel electrode 710 and the organic emission layer 720 may be reduced or effectively prevented.

Also, by using the same photosensitive film pattern having the different thicknesses, the contact hole 82 overlapping the drain electrode 175 is formed in the capping layer 180*b* and the second interlayer insulating layer 180*a* Simultaneously, the third opening 84 that does not overlap the organic light emitting element 70 is formed in the capping layer 180*b*, thereby forming the third opening 84 for discharging the gas in the capping layer 180*b* along with the contact hole 82 without the addition of the exposure mask.

As above-described, as the third opening 84 is formed at the position that does not overlap the organic light emitting element 70 in the capping layer 180*b* without the addition of the exposure mask, the remaining gas among the gas generated when forming the second interlayer insulating layer 180*a* is discharge through the third opening 84 without a cost increase from additional manufacturing processes. Accordingly, the third opening 84 may help to reduce or effectively prevent the gas generated when forming the second interlayer insulating layer 180*a* from being discharged to the organic light emitting element 70.

Figure 14:
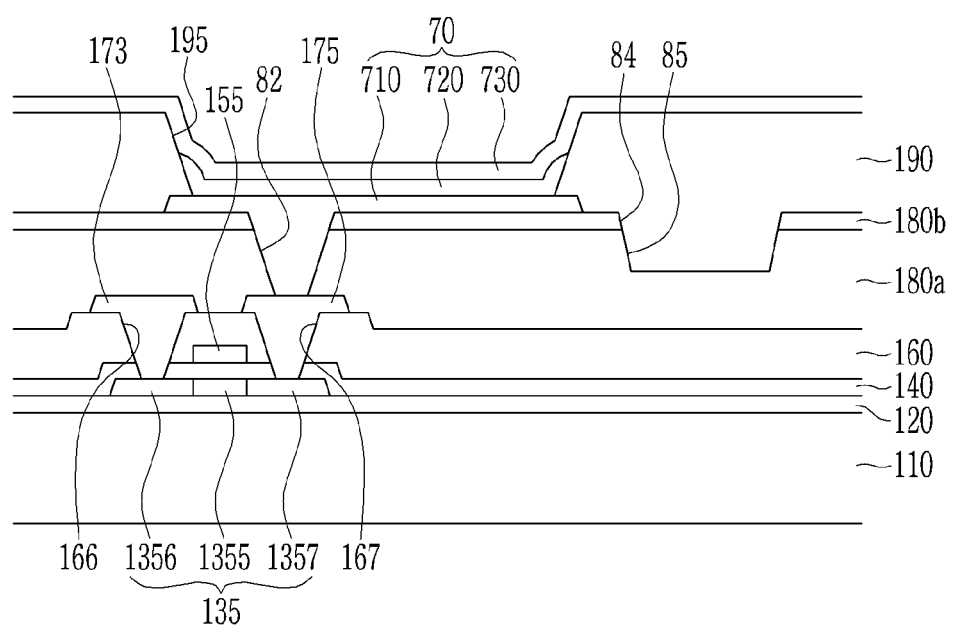
FIG. 14 is a cross-sectional view of yet another exemplary embodiment of a display device according to the invention.

The display device according to another exemplary embodiment will now be described with reference to FIG. 14. FIG. 14 is a cross-sectional view of yet another exemplary embodiment of a display device according to the invention. Referring to FIG. 14, the display device according to the present exemplary embodiment is similar to the display device according to the exemplary embodiment described with reference to FIG. 1 and the display device according to the exemplary embodiment described with reference to FIG. 9. The detailed description for the same constituent elements is omitted.

In the display device according to the present exemplary embodiment, the buffer layer 120 is disposed on the substrate 110.

The semiconductor layer 135 including the channel region 1355, and the source region 1356 and the drain region 1357 disposed at respective sides of the channel region 1355, is disposed on the buffer layer 120.

The gate insulating layer 140 is disposed on the semiconductor layer 135, the gate electrode 155 is disposed on the gate insulating layer 140, and the first interlayer insulating layer 160 is disposed on the gate electrode 155. The first interlayer insulating layer 160 and the gate insulating layer 140 have a source contact hole 166 and a drain contact hole 167 defined therein overlapping the source region 1356 and the drain region 1357.

The source electrode 173 and the drain electrode 175 are disposed on the first interlayer insulating layer 160, and the second interlayer insulating layer 180*a* is disposed on the source electrode 173 and the drain electrode 175. The second interlayer insulating layer 180*a* includes the organic material. The second interlayer insulating layer 180*a* does not include sulfur and does not have photosensitivity. In an exemplary embodiment, for example, the second interlayer insulating layer 180*a* may include at least one among an acryl, a polyimide, and a siloxane-based binder. The second interlayer insulating layer 180*a* may be transparent, or may include the black color pigment or the dye.

The capping layer 180*b* is disposed on the second interlayer insulating layer 180*a*. The capping layer 180*b* includes the inorganic material. In an exemplary embodiment, for example, the capping layer 180*b* may include a silicon nitride ($SiN_x$), a silicon oxide ($SiO_x$), a silicon oxynitride (SiON), or a silicon oxycarbide (SiOC). The dielectric constant of the capping layer 180*b* may be about 1 to about 10.

The second interlayer insulating layer 180*a* and the capping layer 180*b* have the contact hole 82 overlapping the drain electrode 175, and the contact hole 82 of the capping layer 180*b* and the contact hole 82 of the second interlayer insulating layer 180*a* are vertically aligned with each other. The capping layer 180*b* has the third opening 84 defined therein disposed at the position that does not overlap the organic light emitting element 70, and the second interlayer insulating layer 180*a* has a groove 85 defined therein overlapping the third opening 84 of the capping layer 180*b*.

The pixel electrode 710 is disposed on the capping layer 180*b*, and the pixel electrode 710 is connected to the drain electrode 175 through and at the contact hole 82.

The partition wall 190 is disposed on the pixel electrode 710. The partition wall 190 has the first opening 195 defined therein overlapping the pixel electrode 710.

The organic emission layer 720 is disposed in the first opening 195 of the partition wall 190.

The common electrode 730 is disposed on the partition wall 190 and the organic emission layer 720. The pixel electrode 710, the organic emission layer 720, and the common electrode 730 form the organic light emitting element 70.

As above-described, the second interlayer insulating layer 180*a* disposed under the organic light emitting element 70 includes the organic material. In a process of forming the second interlayer insulating layer 180*a* including or made of the organic material, the baking process is included. The gas may be generated while the organic material is cured through the baking process.

All of the gas generated in a conventional method of manufacturing a display device may not be discharged until the organic light emitting element 70 is formed on the second interlayer insulating layer 180*a*. The remaining gas that is not all discharged when forming the second interlayer insulating layer 180*a* may be discharged to the organic light emitting element 70, and the organic emission layer 720 or the pixel electrode 710 of the organic light emitting element 70 may be degraded. In this way, the light emission characteristic may be deteriorated by the degradation of the organic light emitting element 70.

However, in one or more exemplary embodiment of the display device according to the invention, the capping layer 180*b* including the inorganic material is disposed between the second interlayer insulating layer 180*a* including the organic material and the organic light emitting element 70. As the second interlayer insulating layer 180*a* does not include sulfur, the gas generation element causing the display quality deterioration of the display device is reduced. Accordingly, even if the gas is generated during the baking, the influence on the degradation of the organic light emitting element may be reduced.

Also, as the second interlayer insulating layer 180*a* does not have photosensitivity, when forming the contact hole in the second interlayer insulating layer 180*a*, the second interlayer insulating layer 180*a* is not directly exposed and is etched by using the etching mask, thereby reducing or effectively preventing the reduction of the aperture ratio of the display device.

The capping layer 180*b* overlying the second interlayer insulating layer 180*a* may reduce or effectively prevent the gas generated when forming the second interlayer insulating layer 180a from being discharged to the organic light emitting element 70. Also, according to one or more exemplary embodiment of the display device according to the invention, as the capping layer 180b has the third opening 84 disposed at the position that does not overlap the organic light emitting element 70, the remaining gas among the gas generated when forming the second interlayer insulating layer 180a may be discharged through the third opening 84. Accordingly, discharge to the organic light emitting element 70 of the gas generated when forming the second interlayer insulating layer 180a is further reduced or effectively prevented.

Figure 15:
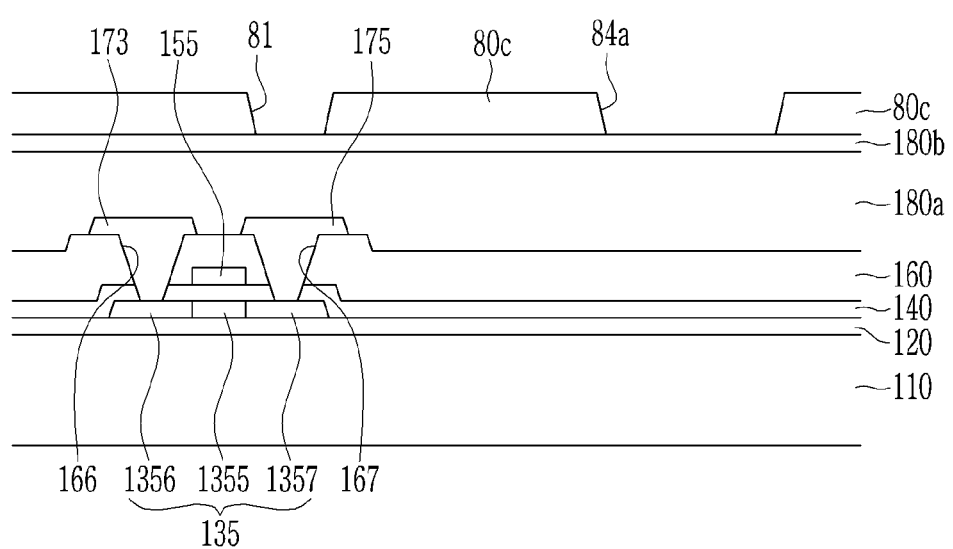
FIG. 15 and FIG. 16 are cross-sectional views showing an exemplary embodiment of a method for manufacturing the display device of FIG. 14 according to the invention.
Figure 16:
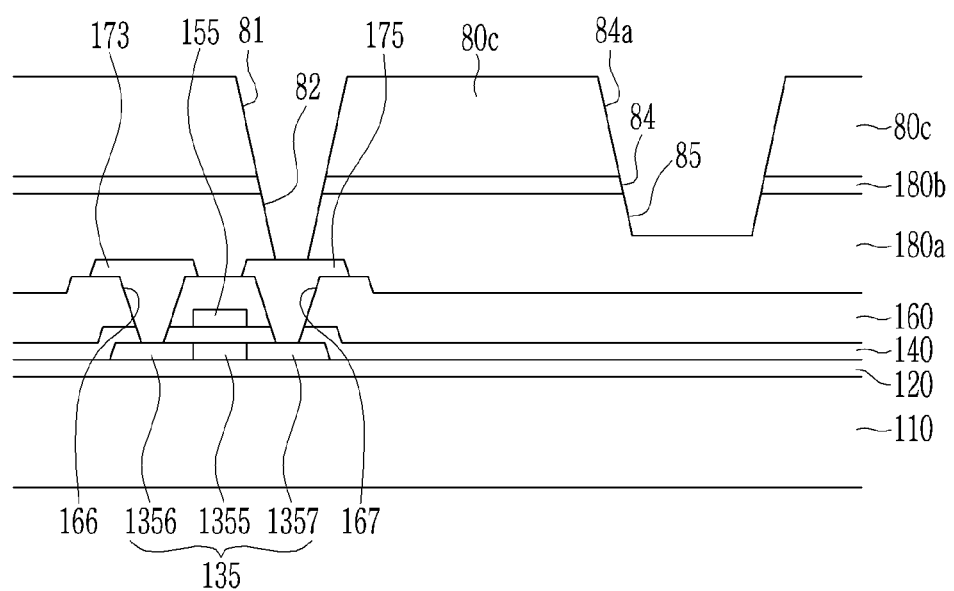

Next, a manufacturing method of the display device according to another exemplary embodiment will be described with reference to FIG. 15 and FIG. 16 along with FIG. 14. FIG. 15 to FIG. 16 are cross-sectional views showing an exemplary embodiment of a method for manufacturing the display device of FIG. 14 according to the invention.

Referring to FIG. 15, the buffer layer 120 is deposited on the substrate 110, the semiconductor layer 135 including the channel region 1355, and the source region 1356 and the drain region 1357 disposed at respective sides of the channel region 1355, is formed on the buffer layer 120, the gate insulating layer 140 is formed on the semiconductor layer 135, the gate electrode 155 is formed on the gate insulating layer 140, the first interlayer insulating layer 160 is formed on the gate electrode 155, the source electrode 173 and the drain electrode 175 are formed on the first interlayer insulating layer 160, the second interlayer insulating layer 180a is formed on the source electrode 173 and the drain electrode 175, the capping layer 180b is deposited on the second interlayer insulating layer 180a, and a fourth photosensitive film pattern 80c is formed on the capping layer 180b by using the exposure mask and the exposure.

In detail, the capping layer 180b is deposited on the second interlayer insulating layer 180a after completing the baking process when forming the second interlayer insulating layer 180a.

The fourth photosensitive film pattern 80c has the second opening 81 at the position to form the contact hole 82 overlapping the drain electrode 175, and a fourth opening 84a disposed at the position where the third opening 84 of the capping layer 180b is to be formed.

By etching the capping layer 180b and the second interlayer insulating layer 180a by using the fourth photosensitive film pattern 80c as the mask, as shown in FIG. 16, the contact hole 82 overlapping the drain electrode 175 is formed in the capping layer 180b and the second interlayer insulating layer 180a, and the third opening 84 that does not overlap the organic light emitting element 70 is formed in the capping layer 180b.

After the contact hole 82 and the third opening 84 are formed, the fourth photosensitive film pattern 80c is removed. In this case, an upper thickness portion of the second interlayer insulating layer 180a overlapping the third opening 84 is removed to form the groove 85 overlapping the third opening 84 of the capping layer 180b in the second interlayer insulating layer 180a.

The thickness of the second interlayer insulating layer 180a is different depending on the position thereof. In detail, referring to FIG. 15, an original thickness of the second interlayer insulating layer 180a at the contact hole 82 is smaller than the thickness of the second interlayer insulating layer 180a at the third opening 84. By this thickness difference, when etching the second interlayer insulating layer 180a by using the fourth photosensitive film pattern 80c as the mask, as shown in FIG. 16, the second interlayer insulating layer 180a having the relatively small thickness and corresponding to the contact hole 82 is completely removed to expose the drain electrode 175, while the second interlayer insulating layer 180a having the relatively large thickness at the third opening 84 is not completely removed and partially remains to form the groove 85.

As shown in FIG. 14, the pixel electrode 710 is formed on the capping layer 180b, the partition wall 190 is formed on the pixel electrode 710, and the organic emission layer 720 and the common electrode 730 are formed.

According to one or more exemplary embodiment of the manufacturing method of the display device according to the invention, as the capping layer 180b covering the second interlayer insulating layer 180a is formed after forming the second interlayer insulating layer 180a, the capping layer 180b is formed on the second interlayer insulating layer 180a after the baking process for forming the second interlayer insulating layer 180a is completed. That is, since the second interlayer insulating layer 180a is exposed to outside during the baking process thereof, the gas generated during the baking process of the second interlayer insulating layer 180a is discharged to the outside. Accordingly, as the second interlayer insulating layer 180a is additionally covered and protected by the capping layer 180b after the gas generated during the baking process is discharged to the outside, discharge of the gas generated when forming the second interlayer insulating layer 180a to the pixel electrode 710 and the organic emission layer 720 may be reduced or effectively.

Also, by using the same one photosensitive film pattern, the contact hole 82 overlapping the drain electrode 175 is formed in the capping layer 180b and the second interlayer insulating layer 180a, and simultaneously the third opening 84 that does not overlap the organic light emitting element 70 is formed in the capping layer 180b and the groove 85 overlapping the third opening 84 of the capping layer 180b is formed in the second interlayer insulating layer 180a, thereby forming the third opening 84 for discharging the gas in the capping layer 180b along with the contact hole 82 without the addition of an exposure mask.

As above-described, as the third opening 84 is formed at the position that does not overlap the organic light emitting element 70 in the capping layer 180b without the addition of the exposure mask, the remaining gas among the gas generated when forming the second interlayer insulating layer 180a is discharged through the third opening 84 without a cost increase from additional manufacturing processes. Accordingly, the third opening 84 may help to reduce or effectively prevent the gas generated when forming the second interlayer insulating layer 180a from being discharged to the organic light emitting element 70.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method for manufacturing a display device, comprising:
   providing a thin film transistor on a substrate;
   providing an interlayer insulating layer including an organic material on the thin film transistor;

providing a capping layer including an inorganic material on the interlayer insulating layer;

providing a first photosensitive film pattern having different heights depending on positions on the capping layer;

first etching the capping layer and the interlayer insulating layer by using the first photosensitive film pattern as a mask;

decreasing a height of the first photosensitive film pattern to form a second photosensitive film pattern;

second etching the capping layer by using the second photosensitive film pattern as a mask; and providing an organic light emitting element on the capping layer, wherein a contact hole overlapping the drain electrode of the thin film transistor is formed in the interlayer insulating layer and the capping layer through the first etching, and an opening that does not overlap the organic light emitting element is formed in the capping layer through the second etching.

2. The method of claim 1, wherein the interlayer insulating layer does not have photosensitivity, and the providing of the interlayer insulating layer includes baking the organic material.

3. The method of claim 2, wherein the interlayer insulating layer does not include sulfur.

4. The method of claim 3, wherein the interlayer insulating layer includes a black color pigment or a dye.

5. The method of claim 1, wherein the interlayer insulating layer includes a black color pigment or a dye.

* * * * *